(12) United States Patent
Hung et al.

(10) Patent No.: US 7,777,246 B2
(45) Date of Patent: Aug. 17, 2010

(54) LIGHT EMITTING DIODE WITH INORGANIC BONDING MATERIAL FORMED WITHIN

(75) Inventors: Shih-Hao Hung, Taipei (TW); Chih-Ming Lai, Taipei (TW)

(73) Assignee: Lite-On Technology Corp., Taipei (TW)

( * ) Notice: Subject to any disclaimer, the term of this patent is extended or adjusted under 35 U.S.C. 154(b) by 0 days.

(21) Appl. No.: 12/071,615

(22) Filed: Feb. 25, 2008

(65) Prior Publication Data

US 2009/0108284 A1    Apr. 30, 2009

(30) Foreign Application Priority Data

Oct. 26, 2007    (TW) .............................. 96140362 A

(51) Int. Cl.
*H01L 33/20* (2010.01)
(52) U.S. Cl. .................... 257/99; 257/79; 257/E33.075
(58) Field of Classification Search .................... 257/99, 257/79, E33.057, E33.075
See application file for complete search history.

(56) References Cited

U.S. PATENT DOCUMENTS

| 6,274,924 | B1 | 8/2001 | Carey et al. | |
| 2004/0016873 | A1* | 1/2004 | Kida et al. | 250/214 R |
| 2006/0125716 | A1* | 6/2006 | Wong et al. | 345/46 |
| 2006/0261364 | A1* | 11/2006 | Suehiro et al. | 257/100 |

* cited by examiner

*Primary Examiner*—Lynne A Gurley
*Assistant Examiner*—Vernon P Webb
(74) *Attorney, Agent, or Firm*—Rosenberg, Klein & Lee

(57) ABSTRACT

A light emitting device includes: a chip-mounting base; a light emitting chip mounted on the chip-mounting base; and a transparent encapsulant enclosing the light emitting chip and bonded to the chip-mounting base through a bonding material. The bonding material is an inorganic compound selected from one of a nitride compound and an oxide compound.

11 Claims, 4 Drawing Sheets

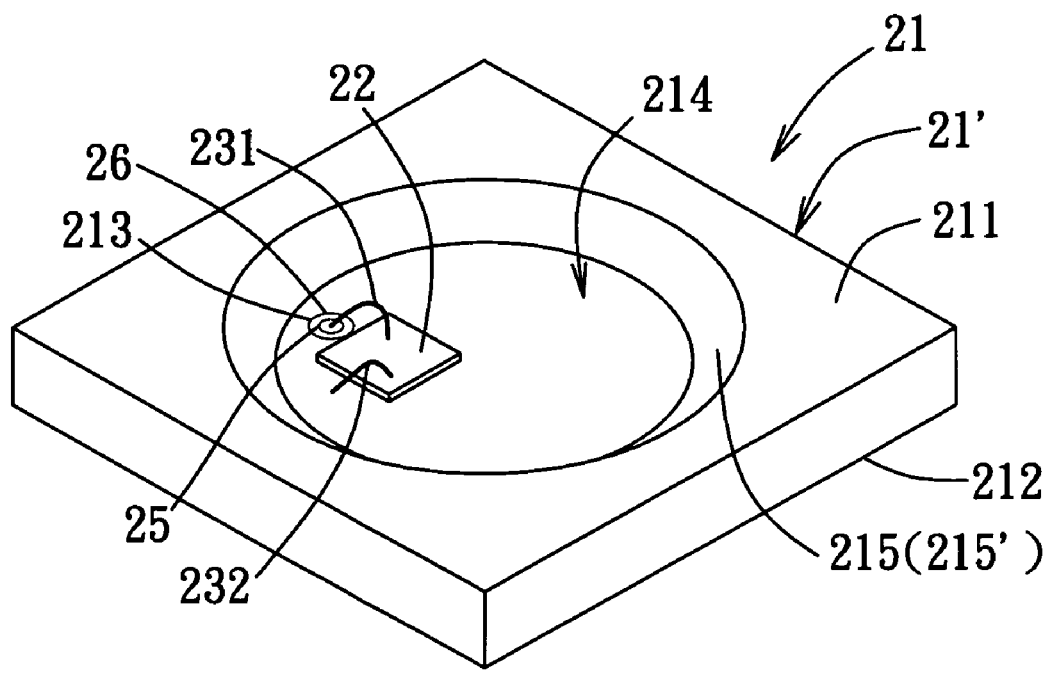
F I G. 2

LIGHT EMITTING DIODE WITH INORGANIC BONDING MATERIAL FORMED WITHIN

CROSS-REFERENCE TO RELATED APPLICATION

This application claims priority of Taiwanese application no. 096140362, filed on Oct. 26, 2007.

BACKGROUND OF THE INVENTION

1. Field of the Invention

This invention relates to a light emitting device, more particularly to a light emitting device including a chip-mounting base and a transparent encapsulant bonded to the chip-mounting base through a bonding material of a nitride or oxide compound.

2. Description of the Related Art

FIG. 1 illustrates a conventional light emitting device that includes a cup-shaped base 11 defining a recess, a pair of conductive leads 13 mounted on the base 11, a light emitting chip 12 mounted on the base 11 within the recess and wire-bonded to the conductive leads 13 through a pair of bonding wires 15, and an encapsulant 14 filling the recess and enclosing the light emitting chip 12. The conventional light emitting device is disadvantageous in that it has a relatively poor efficiency in dissipating heat generated by the light emitting chip 12.

U.S. Pat. No. 6,274,924 discloses a light emitting device that uses a metallic material for the base so as to enhance the heat dissipating efficiency. However, the transparent encapsulant tends to peel off from the base due to a relatively large difference in expansion coefficients therebetween.

SUMMARY OF THE INVENTION

Therefore, the object of the present invention is to provide a light emitting device that can overcome the aforesaid drawbacks associated with the prior art.

According to this invention, a light emitting device comprises: a chip-mounting base; a light emitting chip mounted on the chip-mounting base; and a transparent encapsulant enclosing the light emitting chip and bonded to the chip-mounting base through a bonding material. The bonding material is an inorganic compound selected from one of a nitride compound and an oxide compound.

BRIEF DESCRIPTION OF THE DRAWINGS

Other features and advantages of the present invention will become apparent in the following detailed description of the preferred embodiments of the invention, with reference to the accompanying drawings, in which:

FIG. 2 is a perspective view of the first preferred embodiment of a light emitting device according to this invention;

DETAILED DESCRIPTION OF THE PREFERRED EMBODIMENTS

Figure 1:
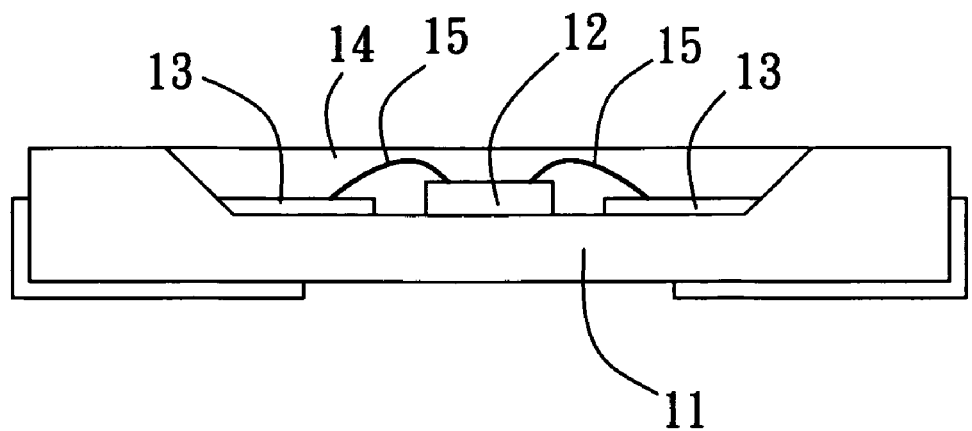
FIG. 1 is a schematic view of a conventional light emitting device.

Before the present invention is described in greater detail with reference to the accompanying preferred embodiments, it should be noted herein that like elements are denoted by the same reference numerals throughout the disclosure.

Figure 3:
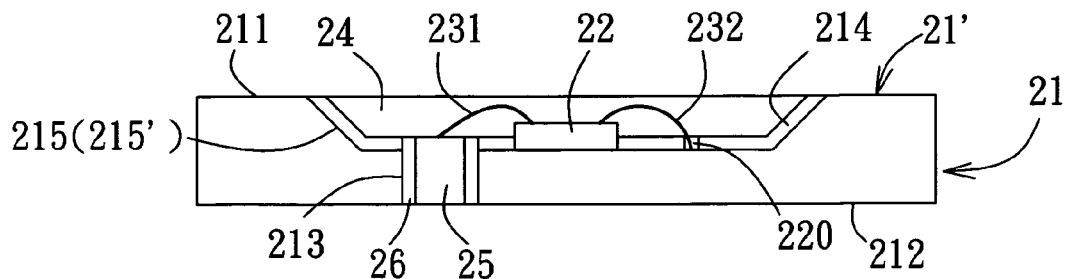
FIG. 3 is a schematic view of the first preferred embodiment.

FIGS. 2 and 3 illustrate the first preferred embodiment of a light emitting device according to the present invention. The light emitting device includes: a chip-mounting base 21; a light emitting chip 22 mounted on the chip-mounting base 21; and a transparent encapsulant 24 enclosing the light emitting chip 22 and bonded to the chip-mounting base 21 through a bonding material 214. The bonding material 214 is an inorganic compound selected from one of a nitride compound and an oxide compound. Preferably, the inorganic compound is one of the nitride compound and the oxide compound of an element selected from the group consisting of Ti, Zn, In, Ta, Cr, Al, and Si.

In this embodiment, the chip-mounting base 21 includes a heat-dissipating body 21' made from a metallic material, having upper and lower surfaces 211, 212 and formed with a through-hole 213 extending through the upper and lower surfaces 211, 212. The heat-dissipating body 21' is cup-shaped, and defines an encapsulant-receiving recess 215 defined by a recess-defining wall 215'. The light emitting chip 22 is mounted on the upper surface 211 at the recess-defining wall 215' of the heat-dissipating body 21'. The bonding material 214 is formed on the recess-defining wall 215'. The transparent encapsulant 24 fills the encapsulant-receiving recess 215. The chip-mounting base 21 is provided with a metal post 25 extending into the through-hole 213, and an insulator sleeve 26 sleeved on the metal post 25 and fitted into the through-hole 213. The light emitting chip 22 is coupled electrically to the metal post 25 through a first bonding wire 231, and to the heat-dissipating body 21' through a second bonding wire 232 that extends through an opening 220 in the bonding material 214 to contact the heat-dissipating body 21'.

Preferably, the heat-dissipating body 21' and the metal post 25 are made from a metallic material selected from the group consisting of Cu, Mo, W, Al, Au, Cr, Ni, Zn, Pt, Ag, and alloys thereof, and are formed through metal injection molding techniques. In the molding operation, the insulator sleeve 26 is placed in a mold (not shown), and the metallic material is injected into the mold so as to form the metal post 25 and the heat-dissipating body 21'.

The bonding material 214 is preferably formed through deposition techniques, such as physical vapor deposition, chemical vapor deposition, or sputtering techniques.

Preferably, the transparent encapsulant 24 is made from a polymeric material, such as epoxy resin or silicone.

Figure 4:
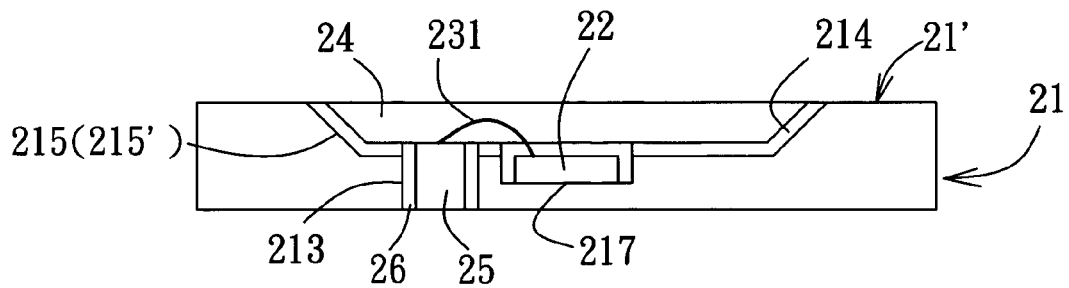
FIG. 4 is a schematic view of the second preferred embodiment of the light emitting device according to this invention.

FIG. 4 illustrates the second preferred embodiment of the light emitting device according to this invention. The second preferred embodiment differs from the previous embodiment in that the recess-defining wall 215' is formed with a chip-receiving recess 217 for receiving the light emitting chip 22 therein. In addition, the light emitting chip 22 has electrodes (not shown) formed on upper and lower surfaces thereof, respectively. The upper electrode of the light emitting chip 22 is connected to the metal post 25 through the first bonding wire 231, while the lower electrode of the light emitting chip 22 is in contact with the heat-dissipating body 21'.

Figure 5:
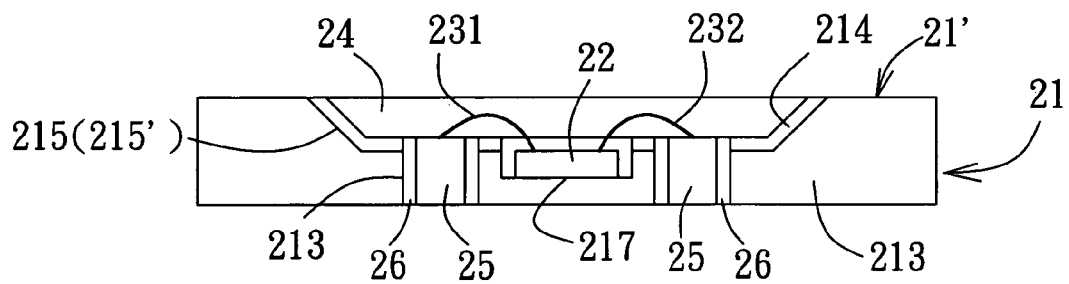
FIG. 5 is a schematic view of the third preferred embodiment of the light emitting device according to this invention.

FIG. 5 illustrates the third preferred embodiment of the light emitting device according to this invention. The third preferred embodiment differs from the second preferred embodiment in that the heat-dissipating body 21' is further formed with a second through-hole 213 and that the chip-mounting base 21 is further provided with a second metal post 25 extending into the second through-hole 213, and a second insulator sleeve 26 sleeved on the second metal post 25 and fitted into the second through-hole 213. In this embodiment, the second bonding wire 232 is wire-bonded to the second metal post 25. Since the heat-dissipating body 21' does not serve as an electrical connection for the light emitting device unlike the previous preferred embodiments, the heat-dissipating body 21' can be made from a ceramic material that has a higher thermal conductivity.

Figure 6:
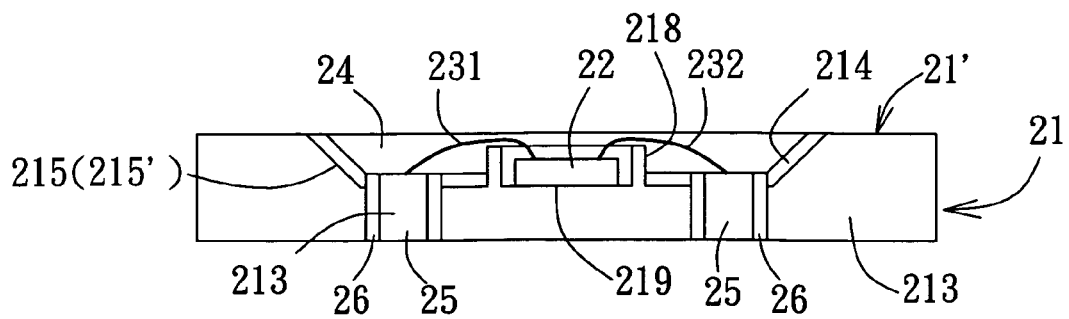
FIG. 6 is a schematic view of the fourth preferred embodiment of the light emitting device according to this invention.

FIG. 6 illustrates the fourth preferred embodiment of the light emitting device according to this invention. The fourth preferred embodiment differs from the third preferred embodiment in that the chip-mounting base 21 is formed with a protrusion 218 protruding from the recess-defining wall 215' into the encapsulant-receiving recess 215 and defining a chip-receiving recess 219 for receiving the light emitting chip 22 therein.

Figure 7:
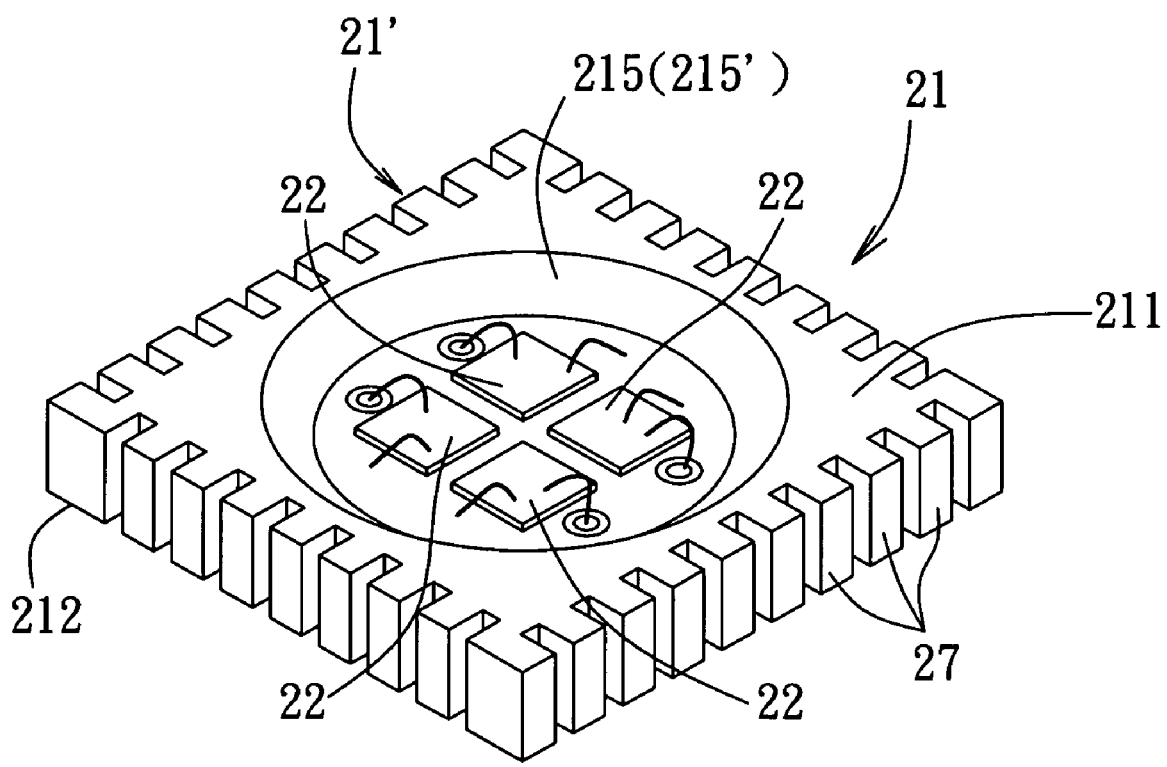
FIG. 7 is a perspective view of the fifth preferred embodiment of the light emitting device according to this invention.

FIG. 7 illustrates the fifth preferred embodiment of the light emitting device according to this invention. The fifth preferred embodiment differs from the first preferred embodiment in that a plurality of the light emitting chips 22 are mounted on the recess-defining wall 215' of the heat-dissipating body 21' and that the heat-dissipating body 21' is formed with a plurality of heat-dissipating fins 27 at a peripheral edge for enhancing the heat dissipating efficiency. Alternatively, the heat-dissipating fins 27 can be formed on the lower surface 212 of the heat-dissipating body 21'.

Figure 8:
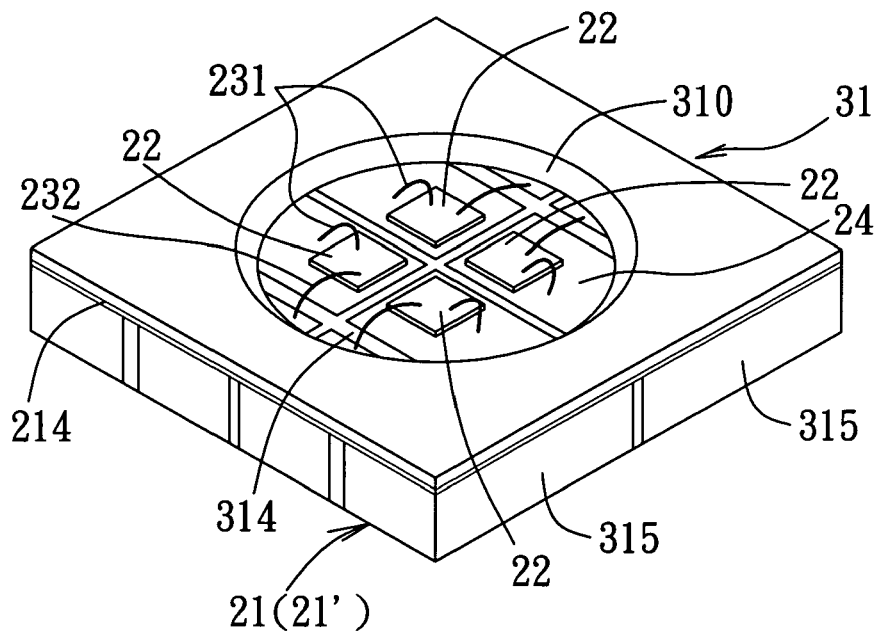
FIG. 8 is a top perspective view of the sixth preferred embodiment of the light emitting device according to this invention.
Figure 9:
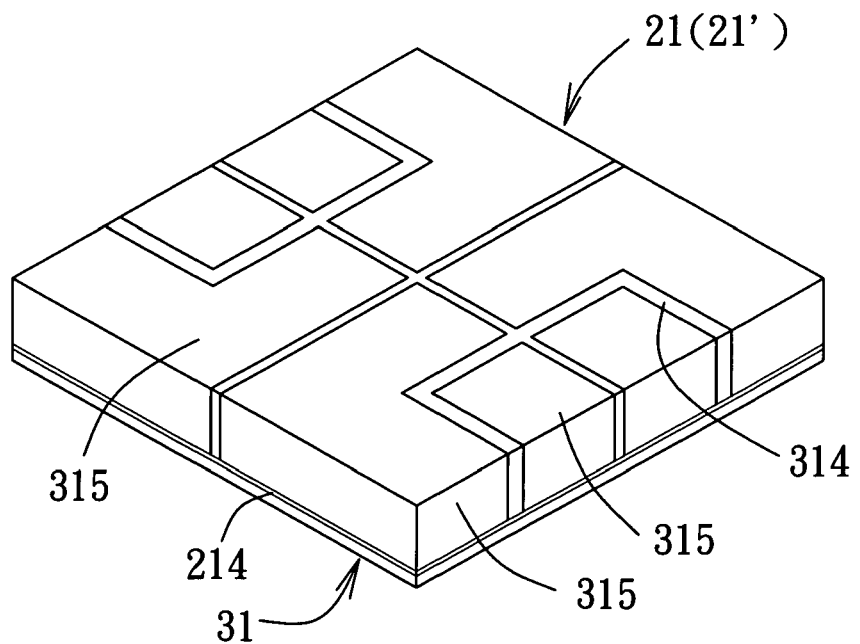
FIG. 9 is a bottom perspective view of the sixth preferred embodiment.

FIGS. 8 and 9 illustrate the sixth preferred embodiment of the light emitting device according to this invention. The sixth preferred embodiment differs from the first preferred embodiment in that the chip-mounting base 21 includes an insulator cellular frame 314 defining a plurality of cell spaces, and a plurality of metal blocks 315 fitted respectively into the cell spaces and cooperatively defining the heat-dissipating body 21'. The bonding material 214 is formed on the cellular frame 314 and the metal blocks 315. The chip-mounting base 21 further includes a top cover 31 disposed on the bonding material 214 and formed with an opening 310 for exposing the light emitting chips 22 and portions of the metal blocks 315. The transparent encapsulant 24 fills the opening 310. The first and second bonding wires 231, 232 of each of the light emitting chips 22 extend through the bonding material 214 to contact two adjacent ones of the metal blocks 315, respectively. The metal blocks 315 together with the cellular frame 314 can be formed through metal injection molding techniques.

With the inclusion of the bonding material 214 in the light emitting device of this invention to bond the transparent encapsulant 24 to the heat-dissipating body 21' of the chip-mounting base 21, the aforesaid peeling drawback associated with the prior art can be eliminated.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A light emitting device comprising:
   a chip-mounting base formed of metal and including a heat-dissipating body having upper and lower surfaces and formed with heat-dissipating fins and a through-hole extending through said upper and lower surfaces;
   a light emitting chip mounted on a portion of said upper surface of said heat-dissipating body of said chip-mounting base;
   a bonding material layer formed on said chip-mounting base exclusive of said portion of said upper surface of said heat-dissipating body of said chip-mounting base and external to a periphery of said light emitting chip, said bonding material layer being formed of an inorganic compound selected from one of a nitride compound and an oxide compound; and
   a transparent encapsulant enclosing said light emitting chip and bonded to said chip-mounting base through said bonding material;
   wherein said chip-mounting base is provided with a metal post extending into said through-hole, and an insulator sleeve sleeved on said metal post and fitted into said through-hole, said light emitting chip being coupled electrically to said metal post.

2. The light emitting device of claim 1, wherein said inorganic compound of said bonding material layer is one of the nitride compound and the oxide compound of an element selected from the group consisting of Ti, Zn, In, Ta, Cr, Al, and Si.

3. The light emitting device of claim 1, wherein said heat-dissipating body and said at least one post are formed of the same metal using metal injection molding.

4. The light emitting device of claim 1, wherein said metal is selected from the group consisting of Cu, Mo, W, Al, Au, Cr, Ni, Zn, Pt, Ag, and alloys thereof.

5. The light emitting device of claim 1, wherein said metal of said heat-dissipating body and said metal post is are made from a metal selected from the group consisting of Cu, Mo, W, Al, Au, Cr, Ni, Zn, Pt, Ag, and alloys thereof.

6. The light emitting device of claim 1, wherein said portion of said chip-mounting base is disposed in a cup-shaped recess defined by a recess-defining wall, said light emitting chip being mounted on said recess-defining wall, said bonding material layer being formed on said recess-defining wall, said transparent encapsulant filling said recess.

7. The light emitting device of claim 1, wherein said portion of said chip-mounting base is disposed in a cup-shaped recess defined by a recess-defining wall, said portion of said chip-mounting base being surrounded by a protrusion extending from said recess-defining wall into said recess and defining a chip-receiving recess, said light emitting chip being received in said chip-receiving recess, said bonding material layer being formed on said recess-defining wall external to said protrusion, said transparent encapsulant filling said cup-shaped recess and said chip-receiving recess.

8. The light emitting device of claim 1, wherein said heat-dissipating body has a plurality of spaced grooves formed therein to define said heat-dissipating fins between respective pairs of said grooves.

9. The light emitting device of claim 1, wherein said chip-mounting base includes a cellular insulator frame defining a plurality of cell spaces, and a plurality of metal blocks respectively fitted into said cell spaces.

10. The light emitting device of claim 9, wherein said chip-mounting base includes a plurality of portions thereof adapted for mounting a respective light emitting chip thereon, each light emitting chip being electrically coupled to a respective pair of said plurality of metal blocks.

11. The light emitting device of claim 9, wherein said metal blocks are made from a metal selected from the group consisting of Cu, Mo, W, Al, Au, Cr, Ni, Zn, Pt, Ag, and alloys thereof.

\* \* \* \* \*